United States Patent [19]
Mistry et al.

[11] Patent Number: 5,900,225
[45] Date of Patent: May 4, 1999

[54] FORMATION OF DIAMOND MATERIALS BY RAPID-HEATING AND RAPID-QUENCHING OF CARBON-CONTAINING MATERIALS

[75] Inventors: Pravin Mistry, Shelby Township; Shengzhong Liu, Canton, both of Mich.

[73] Assignee: QQC, Inc., Dearborn, Mich.

[21] Appl. No.: 08/648,355

[22] Filed: May 14, 1996

Related U.S. Application Data

[63] Continuation of application No. 08/287,726, Aug. 9, 1994, Pat. No. 5,516,500.
[51] Int. Cl.$^6$ ................................................... C30B 29/02
[52] U.S. Cl. .................................. 423/446; 117/4; 117/7; 117/929
[58] Field of Search ..................... 117/4, 7, 929; 423/446; 204/173, 410

[56] References Cited

U.S. PATENT DOCUMENTS

| | | | |
|---|---|---|---|
| 3,305,331 | 2/1967 | Inoue | 423/446 |
| 3,949,062 | 4/1976 | Vereschagin et al. | 423/446 |
| 4,089,933 | 5/1978 | Vereschagin et al. | 423/446 |
| 5,516,500 | 5/1996 | Liu et al. | 423/446 |

*Primary Examiner*—Robert Kunemund
*Attorney, Agent, or Firm*—Harness, Dickey & Pierce, P.L.C.

[57] ABSTRACT

Diamond materials are formed by sandwiching a carbon-containing material in a gap between two electrodes. A high-amperage electric current is applied between the two electrode plates so as cause rapid-heating of the carbon-containing material. The current is sufficient to cause heating of the carbon-containing material at a rate of at least approximately 5,000° C./sec, and need only be applied for a fraction of a second to elevate the temperature of the carbon-containing material at least approximately 1000° C. Upon terminating the current, the carbon-containing material is subjected to rapid-quenching (cooling). This may take the form of placing one or more of the electrodes in contact with a heat sink, such as a large steel table. The carbon-containing material may be rapidly-heated and rapidly-quenched (RHRQ) repeatedly (e.g., in cycles), until a diamond material is fabricated from the carbon-containing material. The process is advantageously performed in an environment of a "shielding" (inert or non-oxidizing) gas, such as Argon (Ar), Helium (He), or Nitrogen ($N_2$). In an embodiment of the invention, the carbon-containing material is polystyrene (e.g., a film) or glassy carbon (e.g., film or powder). In another embodiment of the invention, the carbon-containing material is a polymer, fullerene, amorphous carbon, graphite, or the like. In another embodiment of the invention, one of the electrodes is substrate upon which it is desired to form a diamond coating, and the substrate itself is used as one of the two electrodes. This would be useful for forming a thin-film diamond coating on a cutting tool insert.

20 Claims, 1 Drawing Sheet

FORMATION OF DIAMOND MATERIALS BY RAPID-HEATING AND RAPID-QUENCHING OF CARBON-CONTAINING MATERIALS

This is a continuation of commonly-owned, U.S. patent application Ser. No. 08/287,726, (Aug. 9, 1994 now U.S. Pat. No. 5,516,500, issued May 14, 1996)

BACKGROUND OF THE INVENTION

As is known, diamond materials exhibit outstanding physical properties including, but not limited to: exceptional hardness; excellent thermal conductivity; high electrical resistance; chemical inertness; high optical transmissiveness; high electrical carrier mobility; and high dielectric breakdown strength. For these reasons, efforts have been made to synthesize diamond and optimize its growth conditions. For example, diamond powders are useful as abrasives, diamond films are useful as optical windows, and diamond coatings are useful to enhance the utility of cutting tool inserts.

Various techniques are known for synthesizing (fabricating) diamond material (e.g., crystals) from carbon, including: high-pressure, high-temperature (HPHT) techniques; conventional flame; torch; alternating current (AC) and direct current (DC) arc; arc jets; hot filament; radio-frequency (RF) chemical vapor deposition (CVD); electron-cyclotron resonance (ECR) enhanced CVD; supersonic beam; ion beam; laser ablation; and laser plasma-assisted synthesis techniques.

As used herein, a "diamond material" includes both diamond (carbon primarily in the sp3 configuration) and "diamond-like carbon" (DLC) (carbon in the sp2 and sp3 configurations).

Generally, for example, CVD processes are used for depositing diamond and DLC films on a substrate (e.g., on a cutting tool insert), and require a vacuum chamber in which to carry out the process, preheating the substrate and a carbon-containing gas, and result in relatively low rates of deposition. There are a number of basic CVD deposition processes currently in use, for depositing diamond coatings. Generally, these processes involve dissociation and ionization of hydrogen and methane precursor gases, which are then passed over and deposited onto a heated substrate. In DC plasma CVD, a DC arc is used to dissociate the precursor gases, and can provide higher gas temperature and energy than most other prior art processes. Microwave CVD uses microwaves to excite the precursor gases, resulting in deposition rates of several microns per hour. Another coating process, related to CVD, is Physical Vapor Deposition (PVD). In PVD, a target in a vacuum chamber is evaporated, as opposed to introducing a gas to the vacuum chamber with CVD. Generally, in any process of fabricating diamond material that requires the use of a vacuum chamber, the size of the substrate that can be coated is limited by the size of the vacuum chamber in which the process is carried out. Generally, in most known processes of fabricating diamond material, the rate of fabrication is relatively low (i.e., the process time is relatively high), and often the process results in the formation of DLC only, containing $SP^2$ and/or $SP^3$ configurations and non-diamond carbon phases (e.g., graphite).

These and other limitations of the prior art are addressed by the techniques of the present invention, which do not depend upon a vacuum environment and which do not require the use of a precursor gas.

SUMMARY OF THE INVENTION

It is therefore an object of the present invention to provide an improved technique for fabricating diamond materials.

It is another object of the present invention to provide a technique for fabricating diamond powders.

It is another object of the present invention to provide a technique for fabricating diamond films, such as thin films on cutting tool inserts.

It is another object of the present invention to provide a technique for fabricating diamond from carbon that is quick, and that can be performed without requiring a vacuum environment.

According to the invention, a carbon-containing material is disposed (sandwiched) between two electrode plates. A high-amperage electric current is applied between the two electrode plates so as cause rapid-heating of the carbon-containing material sandwiched between the electrode plates.

According to an aspect of the invention, the current is applied only for a short time interval, such as less than a second (e.g., one-tenth of a second), and the current applied to flow through the electrodes is sufficient (e.g., 375 amperes) to cause heating of the carbon-containing material at a rate of at least approximately 5,000° C./sec.

According to an aspect of the invention, after the current is removed from the electrodes, the carbon-containing material is subjected to rapid-quenching (cooling). This may take the form of placing one or more of the electrodes in contact with a heat sink, such as a large steel table.

According to an aspect of the invention, the carbon-containing material is rapidly-heated and rapidly-quenched (RHRQ) repeatedly, until a diamond material is fabricated from the carbon-containing material.

According to an aspect of the invention, the process is performed in an environment of a "shielding" (inert or non-oxidizing) gas, such as Argon (Ar), Helium (He), or Nitrogen ($N_2$), and a vacuum environment is not required.

In an embodiment of the invention, the carbon-containing material is polystyrene (e.g., a film) or glassy carbon (e.g., film or powder).

In another embodiment of the invention, the carbon-containing material is a polymer, fullerene, amorphous carbon, graphite, or the like.

In the aforementioned manner of rapidly-heating and rapidly-quenching a carbon-containing material, useful diamond powders and films may be synthesized from carbon-containing materials.

In another embodiment of the invention, one of the electrodes is substrate upon which it is desired to form a diamond coating, and the substrate itself is used as one of the two electrodes. This would be useful for forming a thin-film or a thick-film diamond coating on a cutting tool insert.

Although not at all necessary to the practice of the invention, it is thought that the rapid-heating and rapid-quenching of the carbon-containing material generates a thermal shock wave, and a local, transient, high-temperature, high-pressure environment in which the diamond phase (of carbon) is thermodynamically stable. It is also possible that the material formed by the process is quenched at a metastable diamond or diamond-like stage.

Other objects, features and advantages of the invention will become apparent in light of the following description thereof.

DETAILED DESCRIPTION OF THE INVENTION

Figure 1:
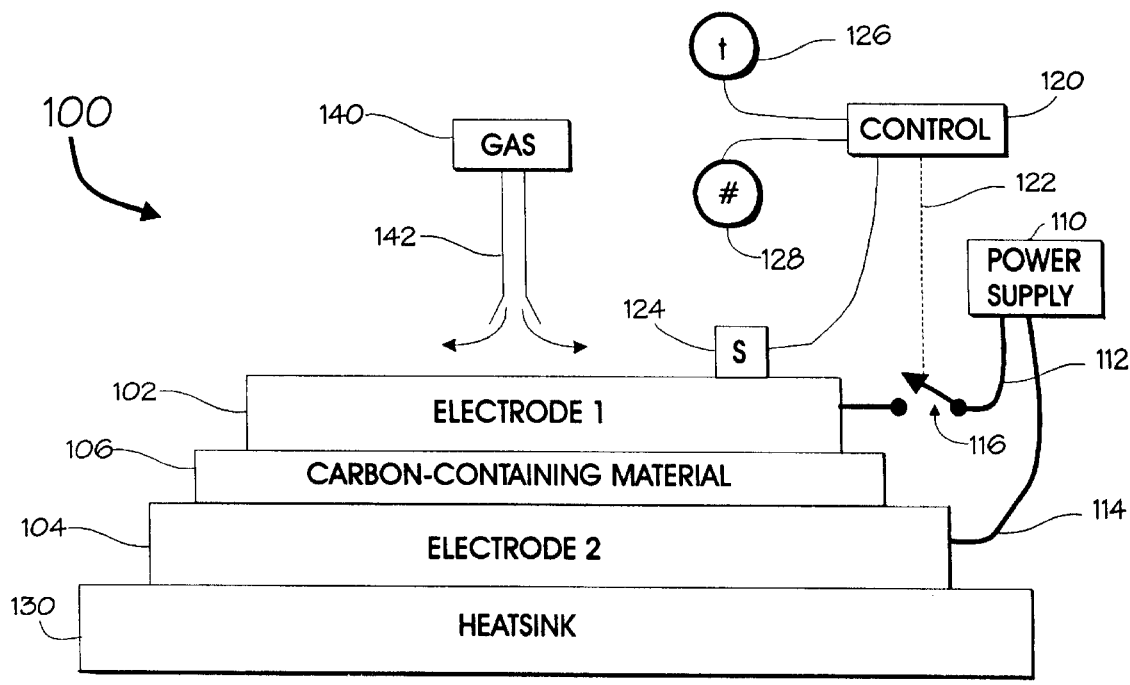
FIG. 1 is a schematic diagram of a system for performing the processes (techniques) of the present invention.

FIG. 1 is a schematic diagram of a system 100 for performing the processes of the present invention. Two electrodes 102 and 104 are spaced apart from one another, so that a carbon-containing material 106 is readily disposed in the resulting gap between the two electrodes 102 and 104. The gap between the two electrodes is preferably adjustable (such as by a micrometer mechanism, not shown), so that the space between the two electrodes may be set to be as small as a zero (no spacing) to as large as one-half centimeter.

A power supply 110 is connected by two lines 112 and 114 to the two electrodes. The power supply 110 provides either direct (DC) or alternating (AC) current across the two electrodes, at a relatively high amperage (e.g., hundreds of amperes). For example, a welding power supply would be serviceable for providing the current required to effect the techniques of the present invention. For applying DC current across the two electrodes, a capacitor could be substituted for the power supply (the capacitor would be charged to a high energy level, then rapidly discharged across the electrodes).

A switch (contactor) 116 is disposed in one (112) of the lines for alternately (and, as will be evident, iteratively or repeatedly) applying and terminating a current from the power supply 110 to the two electrodes 102 and 104. When current is applied to the two electrodes, the current will flow through the carbon-containing material disposed between the two electrodes.

A control circuit 120 may be provided to control the operation of the system 100. As indicated by the dashed line 122, the control circuit 120 is operable to cause closing and opening of the switch 116 (to apply and terminate, respectively, current to the electrodes).

Inputs to the control circuit 120 may include:

a sensor 124 disposed on one (112) of the electrodes for monitoring the temperature (S) of the electrode (and, by implication, the temperature of the carbon-containing material disposed in the gap between the two electrodes), a rheostat 126 (or the like) for setting a time interval (t) that the switch will be caused to be closed by the control circuit, and a selector switch 128 for setting the number (#) of times that the switch 116 will be closed and opened, in iterative cycles of the process.

An infrared sensor could be substituted for the sensor 124, in which case the infrared sensor would not need to be disposed directly on the electrode.

The electrodes 102 and 104 are preferably flat plates (but they could be formed of a conductive liquid (e.g., sodium chloride aqueous solution) or of a conductive powder (e.g., graphite)), and are parallel to one another so that the gap between the two electrodes is approximately of a constant dimension throughout (over the entire surface area of the electrodes). It is, however, within the scope of this invention that one of the electrodes be convex, and the other concave, so long as the gap is preferably maintained to be constant throughout. Other, more complex shapes are contemplated as being within the scope of this invention.

The electrodes 102 and 104 are preferably steel plates, and the arrangement of two, spaced-apart of electrodes is preferably disposed on a heat-sinking surface 130, such as a steel table, so that the carbon-containing material disposed in the gap between the two electrodes will cool rapidly upon terminating the application of a current across the electrodes. The heat-sinking surface may also be actively cooled (e.g., with a coolant passing through cooling channels contained therein, not shown).

The process of the present invention does not require a vacuum environment. However, it is beneficial to "shield" the process (i.e, the fabrication of a diamond material from a carbon-containing material) from oxidation and the like. To this end, it is preferred that the process is performed in an environment of a "shielding" (inert or non-oxidizing) gas, such as Argon (Ar), Helium (He), or Nitrogen ($N_2$). This is readily accomplished by providing a supply 140 of a shielding gas, and causing the shielding gas to flow over the electrodes (as indicated by the curved arrows exiting the gas conduit 142). The shielding gas may be directed from any of a number of angles (orientations) at the system to protect the carbon-containing material from oxidation or contamination.

In use, a carbon-containing material 106 is disposed (sandwiched) between the two electrodes 102 and 104. A high-amperage electric current is applied from the power supply between the two electrode plates so as cause rapid-heating of the carbon-containing material sandwiched between the two electrodes. Preferably, the temperature of the carbon-containing material is elevated by 1000° C. in less than a second.

The high-amperage current need be applied (by closing the switch 116) only for a short time interval (t), such as less than a second (e.g., one-tenth of a second), and the current applied to flow through the electrodes is sufficient (e.g., 375 amperes) to cause heating of the carbon-containing material at least approximately (−5%, +10%) 1000° C. at a rate of at least approximately (+10%) 5,000°/second. The rise in temperature can be monitored, if desired, by the sensor 124. The heating rate of 5,000° C. (or ° K) should be considered to be a minimum heating rate, for successful results, and should be considered to be inclusive of higher heating rates such as approximately 10,000° C./second.

One having ordinary skill in the art to which the present invention most nearly pertains will understand that the magnitude (e.g., amperage) and polarity (e.g., DC or AC) of the current supplied by the power supply will depend upon the surface area of the electrodes, the spacing of (e.g., gap between) the electrodes, as well as the carbon-containing material chosen, and may be empirically determined.

One having ordinary skill in the art to which the present invention most nearly pertains will also understand that the duration (t) and number (#) of iterations required to effect the synthesis of a diamond material from a carbon-containing material will also be dependent upon similar parameters, and may be empirically determined.

Upon opening the switch 116, the carbon-containing material is subjected to rapid-quenching (cooling). As mentioned above, heat-sinking (e.g., 130) is advantageous to effect this result. If desired, the temperature can be monitored (124) to ensure that the carbon-containing material has quenched (cooled) sufficiently (e.g., to room temperature) prior to initiating another rapidheating cycle (e.g., by subsequent closure of the switch). Preferably, the heatsink will effect rapid-quenching of the carbon-containing material in a matter of seconds (e.g., 1–10 seconds).

In order to form a diamond material from a carbon-containing material disposed in the gap between the two electrodes, it may be necessary to iteratively rapidly-heat and rapidly-quench the carbon-containing material. For example, ten cycles of rapidheating followed by rapid-quenching may be required. It is contemplated by the present invention that the carbon-containing material will be subjected to rapid-heating and rapid-quenching a sufficient number (#) of times to ensure that a diamond material is fabricated (synthesized) from the carbon-containing material. Again, depending on the carbon-containing material used, the intensity of the current applied and the number of cycles required to effect this result may be empirically determined.

The invention is useful for fabricating diamond materials from any number of solid (versus gaseous) carbon-containing materials, as well as from viscous (pseudo-solid) materials. For example, the carbon-containing material may be a polystyrene film, a glassy carbon film or a glassy carbon powder. By way of further example, the carbon-containing material may be a polymer, fullerene, amorphous carbon, graphite, or the like.

In the aforementioned manner of rapidly-heating and rapidly-quenching a carbon-containing material, useful diamond powders and films may be synthesized from carbon-containing materials.

In addition to fabricating free-standing films and powders, the invention is useful for coating the surface of a substrate. In such as case, one (e.g., 104) of the electrodes will be the substrate desired to be coated with a diamond material. This would be useful, for example, in the context of forming a thin-film diamond coating on a cutting tool insert, in which case the tool insert itself would function as one of the electrodes.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. For example, a clamping force could be applied to the electrodes to mechanically "pre-load" (or pre-stress) the carbon-containing material. By way of additional example, the heatsink could function as one of the electrodes (e.g., ELECTRODE 2).

The technique of the present invention is reminiscent, in certain respects to rapid thermal annealing (RTA), but is neither anticipated nor suggested thereby. As a general proposition, RTA techniques have been used to study doping—reducing crystal damage generated during the ion implantation doping process, and microstructure modifications. A variety of RTA methods are known for heating semiconductor components such as Si and GaAs wafers, including techniques based on proximity placement of wafers near carbon strip heaters. Presently, most commercial RTA systems use radiation heating techniques via tungsten-halogen lamps. These systems typically have a maximum heating rate of 100–300° C. (° K) per second. Thin film electrical heating is also reported to provide a heating rate of 1,000,000° K/sec.

What is claimed is:

1. Method of fabricating a diamond material from a carbon-containing material, comprising:

disposing a carbon-containing material between two electrodes; applying a high-amperage electric current between the two electrodes to effect a change of temperature of the carbon-containing material; and effecting another change of temperature of the carbon-containing material to achieve a diamond material.

2. Method, according to claim 1, wherein:

the applied current is sufficient to cause rapid-heating of the carbon-containing material at a rate of approximately 5,000°/sec.

3. Method, according to claim 2, wherein:

the current is applied for sufficient time interval to elevate the temperature of the carbon-containing material by at least approximately 1000° C.

4. Method, according to claim 1, further comprising:

removing the current from the electrodes; and subsequently rapidly-quenching the carbon-containing material.

5. Method, according to claim 4, further comprising:

disposing one of the electrodes functions on a heat-sinking surface to facilitate rapid-quenching of the carbon-containing material.

6. Method, according to claim 5, wherein:

the heat-sinking surface is a large steel table.

7. Method, according to claim 1, further comprising:

providing a shielding gas in the environment of the carbon-containing material.

8. Method, according to claim 7, wherein:

the shielding gas is selected from the group comprising inert and non-oxidizing gases.

9. Method, according to claim 8, wherein:

the shielding gas is selected from the group comprising Argon, Helium or Nitrogen.

10. Method, according to claim 1, wherein:

the carbon-containing material is a polystyrene film.

11. Method, according to claim 1, wherein: the carbon-containing material is a glassy carbon film.

12. Method, according to claim 1, wherein:

the carbon-containing material is a glassy carbon powder.

13. Method, according to claim 1, wherein:

the carbon-containing material is selected from the group comprising polymers, fullerenes, amorphous carbon materials and graphite.

14. Method, according to claim 1, wherein:

one of the electrodes is a substrate upon which it is desired to form a diamond coating.

15. Method of fabricating a diaond material from a carbon-containing material, comprising:

subjecting a solid carbon-containing material to repeated cycles of rapid-heating by exposing the carbon-containing material to an electric current and rapid-quenching by exposing the carbon-containing material to a heat sink until a diamond material is fabricated from the carbon-containing material.

16. Method, according to claim 15, further comprising:

generating repeated thermal shock waves in the carbon-containing material.

17. Method, according to claim 15, further comprising:

quenching the carbon-containing material at a thermodynamically stable or metastable diamond or diamond-like stage.

18. System for fabricating a diamond material from a carbon-containing material, comprising:

two spaced-apart electrodes, a gap between the two electrodes adapted in use to receeiove a carbon-containing material;

a solid carbon-containing material sandwiched between the two spaced-apart electrodes;

a high-amperage power supply connected to the two electrodes; and means for applying and for terminating a current from the power supply to the two electrodes.

19. System, according to claim 18, further comprising:

means for iteratively applying and terminating a current to the two electrodes for a predetermined time and for a predetermined number of cycles.

20. System, according to claim 18, further comprising:

means for supplying a shielding gas around the carbon-containing material.

* * * * *